(12) United States Patent  
Yamaguchi (10) Patent No.: US 10,204,687 B2  
(45) Date of Patent: Feb. 12, 2019

(54) SEMICONDUCTOR INTEGRATED CIRCUIT (71) Applicant: Takeshi Yamaguchi, Tokyo (JP)

(72) Inventor: Takeshi Yamaguchi, Tokyo (JP)

(73) Assignee: MISUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/703,368

(22) Filed: Sep. 13, 2017

(65) Prior Publication Data

US 2018/0090214 A1    Mar. 29, 2018

(30) Foreign Application Priority Data

Sep. 28, 2016    (JP) ................................. 2016-190349

(51) Int. Cl.

| | |
|---|---|
| G11C 16/28 | (2006.01) |
| G11C 16/08 | (2006.01) |
| G11C 16/32 | (2006.01) |
| G11C 16/34 | (2006.01) |
| G11C 29/02 | (2006.01) |
| G11C 7/20 | (2006.01) |

(52) U.S. Cl.

CPC ............... *G11C 16/28* (2013.01); *G11C 7/20* (2013.01); *G11C 16/08* (2013.01); *G11C 16/32* (2013.01); *G11C 16/3454* (2013.01); *G11C 29/023* (2013.01); *G11C 29/028* (2013.01)

(58) Field of Classification Search

CPC ................................ G11C 16/28; G11C 16/08  
USPC ........................................................ 365/154  
See application file for complete search history.

(56) References Cited

U.S. PATENT DOCUMENTS

| | | | | |
|---|---|---|---|---|
| 6,509,598 B2 * | 1/2003 | Okuda | ................. | G11C 29/785 257/297 |
| 2005/0276109 A1 * | 12/2005 | Hosono | ................. | G11C 16/32 365/185.18 |
| 2007/0165466 A1 * | 7/2007 | Lehmann | ............... | G11C 17/18 365/200 |
| 2007/0230255 A1 * | 10/2007 | Fukuda | ................... | G11C 7/20 365/189.05 |
| 2010/0208532 A1 * | 8/2010 | Tsumura | ................. | G11C 7/20 365/189.16 |

FOREIGN PATENT DOCUMENTS

JP            2008-289290            11/2008

* cited by examiner

*Primary Examiner* — Huan Hoang  
*Assistant Examiner* — Muna A Techane  
(74) *Attorney, Agent, or Firm* — IPUSA, PLLC (57) ABSTRACT

A semiconductor integrated circuit includes a first circuit, a second circuit, a memory circuit having a plurality of flip-flops, a storage unit, a signal generating unit to produce an operation mode setting signal, a control circuit configured to cause the memory circuit to operate such that the plurality of flip-flops holds a value for setting characteristics of the first circuit when the operation mode setting signal indicates a first operation mode, and configured to cause the memory circuit to operate as a counter to measure a time length used in the second circuit when the operation mode setting signal indicates a second operation mode, and a setting circuit configured to cause trimming data stored in the storage unit to set the characteristic of the first circuit when the operation mode setting signal indicates the second operation mode, the trimming data corresponding to the value held by the memory circuit.

4 Claims, 9 Drawing Sheets

SEMICONDUCTOR INTEGRATED CIRCUIT

BACKGROUND OF THE INVENTION

1. Field of the Invention

The disclosures herein relate to a semiconductor integrated circuit.

2. Description of the Related Art

There is a semiconductor integrated circuit known in the related art that has a register for temporarily storing trimming-purpose data in the trimming mode for correcting the variation of characteristics such as a reference voltage that may vary from product to product (see Patent Document 1, for example). The technology disclosed in Patent Document 1 keeps updating trimming-purpose data stored in the register until the reference voltage satisfies a required level. The same data as the trimming purpose data that is present in the register at the time the reference voltage satisfies the required level is then stored in a fuse unit by blowing some fuses. With this arrangement, the corrected reference voltage is produced by using the data stored in the fuse unit even after the trimming mode is disabled.

Such a register used in the related art is used only during the trimming mode, and is not used after the trimming mode is disabled (e.g., not used in the finished product), which results in inefficient utilization of chip area.

There may be a need to provide a semiconductor integrated circuit with improved utilization of chip area.

RELATED-ART DOCUMENTS

Patent Document

[Patent Document 1] Japanese Patent Application Publication No. 2008-289290

SUMMARY OF THE INVENTION

According to an embodiment, a semiconductor integrated circuit includes a first circuit, a second circuit, a memory circuit having a plurality of flip-flops, a storage unit implemented as nonvolatile memory elements, a signal generating unit implemented as one or more nonvolatile memory elements to produce an operation mode setting signal for selecting one of a plurality of operation modes, a control circuit configured to cause the memory circuit to operate such that the plurality of flip-flops holds a value for setting characteristics of the first circuit when the signal generating circuit produces the operation mode setting signal indicative of a first operation mode, and configured to cause the memory circuit to operate as a counter to measure a time length used in the second circuit when the signal generating circuit produces the operation mode setting signal indicative of a second operation mode, and a setting circuit configured to cause trimming data stored in the storage unit to set the characteristic of the first circuit to correct product variation therein when the signal generating circuit produces the operation mode setting signal indicative of the second operation mode, the trimming data corresponding to the value held by the memory circuit.

According to at least one embodiment, the utilization of chip area in a semiconductor integrated circuit is improved.

DESCRIPTION OF THE PREFERRED EMBODIMENTS

In the following, embodiments of the present invention will be described with reference to the accompanying drawings.

Figure 1:
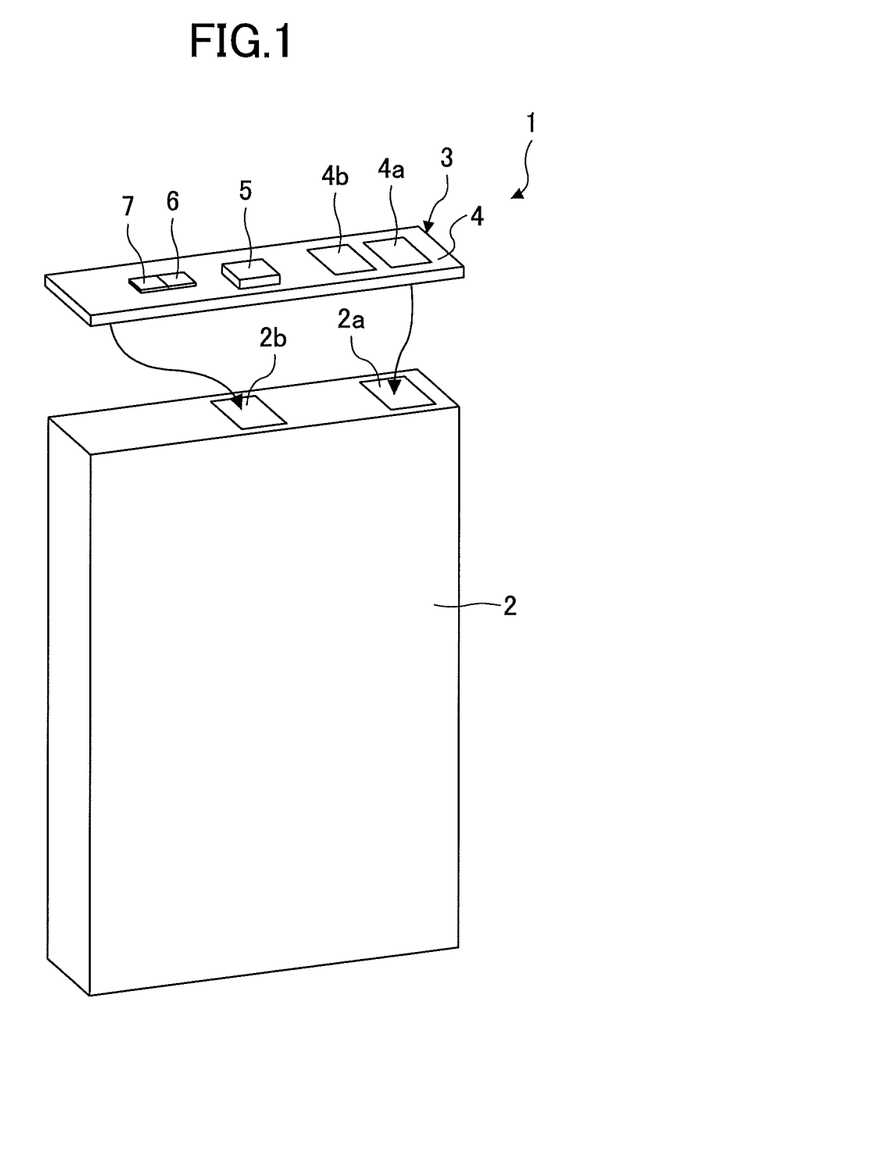
FIG. 1 is a drawing illustrating an example of the configuration of a battery pack.

FIG. 1 is a drawing illustrating an example of the configuration of a battery pack. A battery pack 1 may be used as the power supply for a portable electronic apparatus such as a portable phone. The battery pack 1 includes a battery 2 and a battery monitoring module 3.

The battery 2 is an example of a secondary battery such a lithium ion battery. The battery monitoring module 3 includes a mounting board 4 inclusive of a printed circuit board.

The back face of the mounting board 4 has a positive-pole part connected to a positive pole 2a of the battery 2 situated on a side face thereof and a negative-pole part connected to a negative pole 2b of the battery 2 situated on the side face thereof. The front face of the mounting board 4 has load-connection terminals 4a and 4b situated on one side thereof (i.e., on the right-hand side in FIG. 1) for connection to a portable electronic apparatus such as a portable phone or for connection to a charger or the like for charging the battery 2.

The load-connection terminal 4a is coupled to the positive pole 2a via conductive traces on the mounting board 4. The load-connection terminal 4b is coupled to the negative pole 2b via conductive traces on the mounting board 4. The front face of the mounting board 4 has a semiconductor integrated circuit 5 situated at the center thereof for monitoring the battery 2.

The semiconductor integrated circuit 5 is a chip that monitors the overcharge, over-discharge, and over-current conditions and the like of the battery 2 and that protects the battery 2 from overcharging or the like in response to the monitored conditions. The front face of the mounting board 4 has switch units 6 and 7 situated on the other side of the semiconductor integrated circuit 5 (i.e., the left-hand side thereof in FIG. 1).

Figure 2:
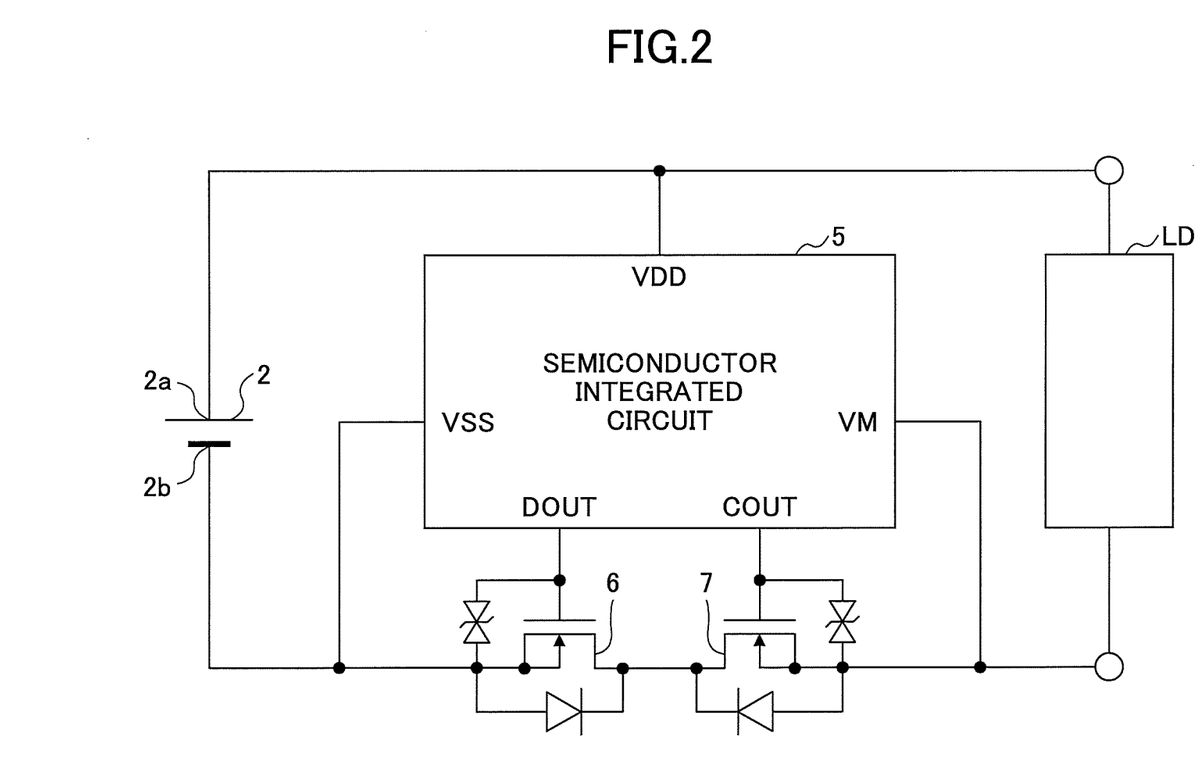
FIG. 2 is a drawing illustrating an example of a circuit configuration inside the battery pack.

FIG. 2 is a drawing illustrating an example of a circuit configuration inside the battery pack.

The semiconductor integrated circuit 5 has a power supply terminal VDD, a ground terminal VSS, a discharge control terminal DOUT, a charge control terminal COUT, and a current detection terminal VM. The positive pole 2a of the battery 2 is connected to the power supply terminal VDD. The negative pole 2b (i.e., reference ground potential) of the battery 2 is connected to the ground terminal VSS.

The negative pole 2b of the battery 2 is connected to a connection node of the switch unit 6. The other connection node of the switch unit 6 is connected to a connection node of the switch unit 7.

The other connection node of the switch unit 7 is connected to the current detection terminal VM. A load circuit LD (e.g., a portable electronic apparatus such as a portable phone or a charger for charging the battery 2) is connected between the current detection terminal VM and the positive pole 2a of the battery 2.

The control node of the switch unit 6 is connected to the discharge control terminal DOUT, and the control node of the switch unit 7 is connected to the charge control terminal COUT. The switch unit 6 is set to either "on" (conductive state) or "off" (nonconductive state) in response to a discharge control signal output from the discharge control terminal DOUT. The switch unit 7 is set to either "on" (conductive state) or "off" (nonconductive state) in response to a charge control signal output from the charge control terminal COUT.

The semiconductor integrated circuit 5 is provided with an overcharge detection circuit that monitors a power supply voltage VD between the power supply terminal VDD and the ground terminal VSS for the purpose of protecting the battery 2 from overcharging, for example. When the overcharge detection circuit detects the power supply voltage VD exceeding a predetermined overcharge detection threshold Vdet1, a control unit 18 (see FIG. 3) of the semiconductor integrated circuit 5 outputs a charge control signal for turning off the switch unit 7 from the charge control terminal COUT (i.e., overcharge protection operation). The turning off of the switch unit 7 serves to block the flow of current charging the battery 2, thereby preventing the battery 2 from overcharging.

The control unit 18 may output the charge control signal for turning off the switch unit 7 after the passage of a predetermined overcharge detection delay time tVdet1 following the detection, by the overcharge detection circuit, of the power supply voltage VD exceeding the predetermined overcharge detection threshold Vdet1. Waiting for the passage of the overcharge detection delay time tVdet1 serves to prevent the switch unit 7 from becoming nonconductive upon erroneously detecting the overcharge condition.

The semiconductor integrated circuit 5 is provided with an over-discharge detection circuit that monitors the power supply voltage VD between the power supply terminal VDD and the ground terminal VSS for the purpose of protecting the battery 2 from over-discharging, for example. When the over-discharge detection circuit detects the power supply voltage VD falling below a predetermined over-discharge detection threshold Vdet2, the control unit 18 (see FIG. 3) of the semiconductor integrated circuit 5 outputs a discharge control signal for turning off the switch unit 6 from the discharge control terminal DOUT (i.e., over-discharge protection operation). The turning off of the switch unit 6 serves to block the flow of current discharging the battery 2, thereby preventing the battery 2 from over-discharging.

The control unit 18 may output the discharge control signal for turning off the switch unit 6 after the passage of a predetermined over-discharge detection delay time tVdet2 following the detection, by the over-discharge detection circuit, of the power supply voltage VD falling below the predetermined over-discharge detection threshold Vdet2. Waiting for the passage of the over-discharge detection delay time tVdet2 serves to prevent the switch unit 6 from becoming nonconductive upon erroneously detecting the over-discharge condition.

The semiconductor integrated circuit 5 is provided with a discharge over-current detection circuit that monitors a current detection voltage VI between the current detection terminal VM and the ground terminal VSS for the purpose of protecting the battery 2 from discharge over-current, for example. When the discharge over-current detection circuit detects the current detection voltage VI exceeding a predetermined discharge over-current detection threshold Vdet3, the control unit 18 (see FIG. 3) of the semiconductor integrated circuit 5 outputs the discharge control signal for turning off the switch unit 6 from the discharge control terminal DOUT (i.e., discharge over-current protection operation). The turning off of the switch unit 6 serves to block the flow of current discharging the battery 2, thereby preventing over-current from flowing in such a direction as to discharge the battery 2.

The control unit 18 may output the discharge control signal for turning off the switch unit 6 after the passage of a predetermined discharge over-current detection delay time tVdet3 following the detection, by the discharge over-current detection circuit, of the current detection voltage VI exceeding the predetermined discharge over-current detection threshold Vdet3. Waiting for the passage of the discharge over-current detection delay time tVdet3 serves to prevent the switch unit from becoming nonconductive upon erroneously detecting the discharge over-current condition.

The semiconductor integrated circuit 5 is provided with a charge over-current detection circuit that monitors a current detection voltage VI between the current detection terminal VM and the ground terminal VSS for the purpose of protecting the battery 2 from charge over-current, for example. When the charge over-current detection circuit detects the current detection voltage VI falling below a predetermined charge over-current detection threshold Vdet4, the control unit 18 (see FIG. 3) of the semiconductor integrated circuit 5 outputs the charge control signal for turning off the switch unit 7 from the charge control terminal COUT (i.e., charge over-current protection operation). The turning off of the switch unit 7 serves to block the flow of current charging the battery 2, thereby preventing over-current from flowing in such a direction as to charge the battery 2.

The control unit 18 may output the charge control signal for turning off the switch unit 7 after the passage of a predetermined charge over-current detection delay time tVdet4 following the detection, by the charge over-current detection circuit, of the current detection voltage VI falling below the predetermined charge over-current detection threshold Vdet4. Waiting for the passage of the charge over-current detection delay time tVdet4 serves to prevent the switch unit 7 from becoming nonconductive upon erroneously detecting the charge over-current condition.

Figure 3:
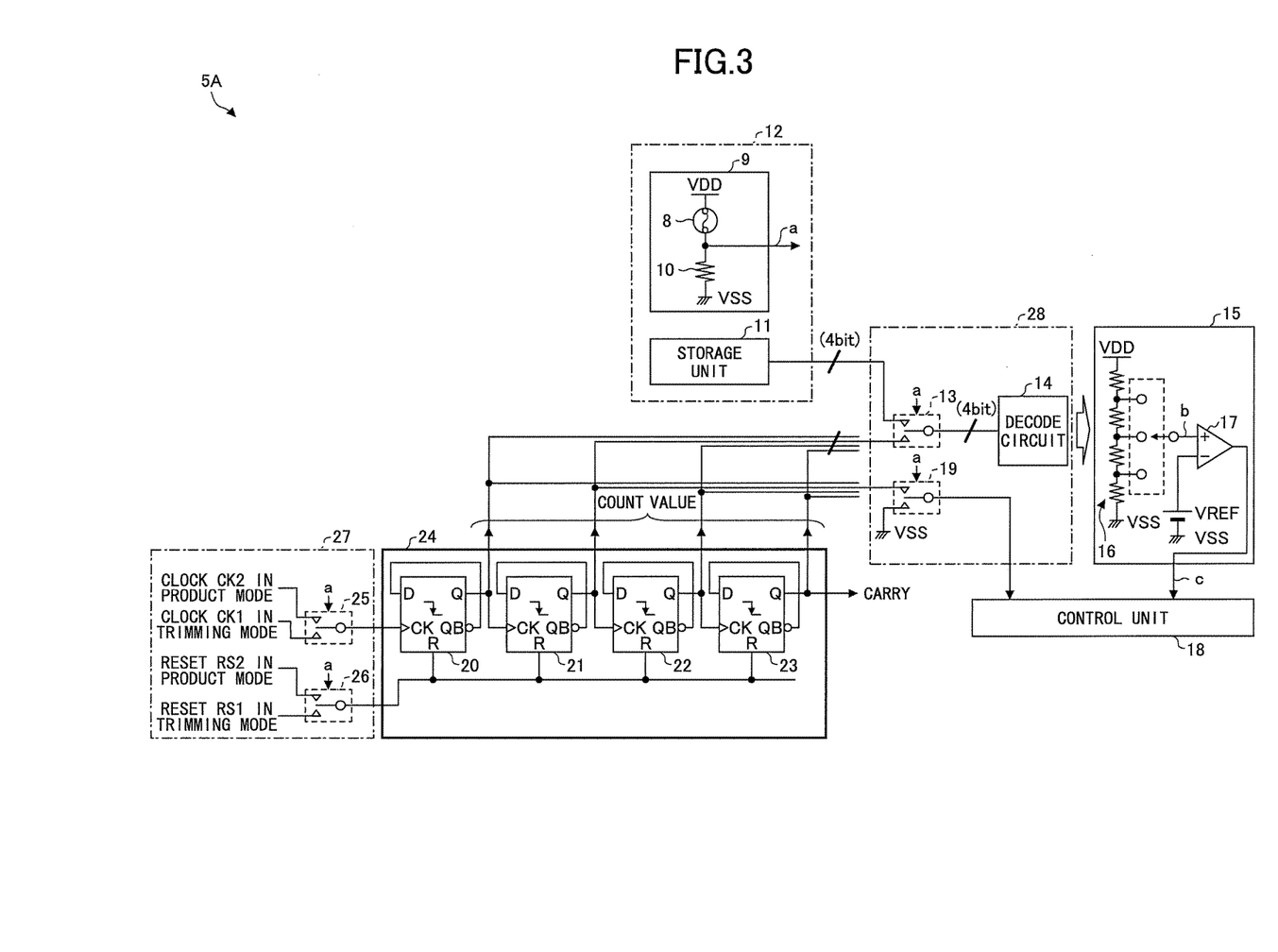
FIG. 3 is a drawing illustrating an example of the configuration of a semiconductor integrated circuit.

FIG. 3 is a drawing illustrating an example of the configuration of the semiconductor integrated circuit. A semiconductor integrated circuit 5A illustrated in FIG. 3 is an example of the semiconductor integrated circuit 5 described above. The semiconductor integrated circuit 5A includes a detection circuit 15, a control unit 18, a memory circuit 24, a memory circuit 12, a control circuit 27, and a setting circuit 28.

The detection circuit 15 monitors the power supply voltage VD between the power supply terminal VDD and the ground terminal VSS. The detection circuit 15 is an example of a first circuit. The detection circuit 15 may be the overcharge detection circuit or the over-discharge detection circuit described above, for example. The detection circuit 15 divides the power supply voltage VD by use of detection resistors 16 to monitor the power supply voltage VD. The detection circuit 15 includes a comparator 17 that compares a reference voltage VREF with the voltage (i.e., divided voltage "b") obtained by dividing the power supply voltage VD by use of the detection resistors 16. The detection circuit 15 outputs a comparison outcome signal "c" of the comparator 17 to the control unit 18. The reference voltage VREF serves as the overcharge detection threshold Vdet1 described above.

The detection circuit 15 may be modified such that the comparator 17 monitors the current detection voltage VI between the current detection terminal VM and the ground terminal VSS. Such a modification provides the discharge over-current detection circuit or the charge over-current detection circuit.

The control unit 18 turns off the switch unit 6 or the switch unit 7 in response to the comparison outcome signal "c" of the comparator 17, thereby protecting the battery 2 from at least one of the overcharge, over-discharge, discharge over-current, and charge over-current conditions. The control unit 18 is an example of a second circuit.

The memory circuit 24, which is an example of a volatile memory circuit having a plurality of flip-flops, includes four flip-flops 20 through 23 in this illustrated example. The memory circuit 24 counts the pulses of a clock CK1 or a clock CK2 input thereinto to temporarily store the obtained count value. The four flip-flops 20 through 23 are series-connected. Each of the flip-flops 20 through 23 has a clock input CK, a data input D, an output Q, an inverted output QB, and a reset input R.

The memory circuit 12 is a circuit that has data stored therein. The memory circuit 12 may be a nonvolatile memory circuit including a signal generating unit 9 and a storage unit 11.

The signal generating unit 9 is an example of a signal generating unit that outputs an operation mode setting signal for selecting one of a plurality of operation modes of the semiconductor integrated circuit 5. The signal generating unit 9 is implemented as a nonvolatile memory element. The signal generating unit 9 may be a nonvolatile memory element having a circuit in which a fuse 8 and a resistor 10 are series-connected, for example. One end of the fuse 8 is connected to the power supply terminal VDD, and one end of the resistor 10 is connected to the ground terminal VSS. An operation mode setting signal "a" is produced at the contact point between the other end of the fuse 8 and the other end of the resistor 10.

The signal generating unit 9 is a nonvolatile memory that is one-time programmable through blowing of the fuse 8. The fuse 8 is blown after the completion of a trimming adjustment performed during the testing of the semiconductor integrated circuit 5. The signal generating unit 9 produces the operation mode setting signal "a" that identifies one of the trimming mode and the product mode in response to whether or not the fuse 8 is intact. In the illustrated configuration, the signal generating unit 9 outputs the operation mode setting signal "a" having the high level indicative of the trimming mode in the case of the fuse 8 being intact. In the case of the fuse 8 being blown, the signal generating unit 9 outputs the operation mode setting signal "a" having the low level indicative of the product mode.

The trimming mode is an example of a first operation mode. The operation mode setting signal "a" having the high level indicative of the trimming mode is an example of the operation mode setting signal for selecting the first operation mode. The product mode is an example of a second operation mode. The operation mode setting signal "a" having the low level indicative of the product mode is an example of the operation mode setting signal for selecting the second operation mode.

The storage unit 11 stores trimming data. The storage unit 11 is implemented as nonvolatile memory elements. The trimming data is stored in the storage unit 11 during the test process of the semiconductor integrated circuit 5A. The storage unit 11 is a nonvolatile memory that is one-time programmable through blowing of fuses, for example. In such a case, the storage unit 11 includes a plurality of circuits each having the same configuration as the signal generating unit 9. The number of the circuits is determined based on the data size of stored trimming data.

The control circuit 27 outputs a clock signal and a reset signal for controlling the memory circuit 24. The control circuit 27 includes a clock switching circuit 25 for switching clock signals supplied to the memory circuit 24 in response to the operation mode selected by the operation mode setting signal "a". The clock switching circuit 25 outputs the clock CK1 in the case of the operation mode setting signal "a" indicating the trimming mode, and outputs the clock CK2 in the case of the operation mode setting signal "a" indicating the product mode. The control circuit 27 includes a reset switching circuit 26 for switching reset signals supplied to the memory circuit 24 in response to the operation mode selected by the operation mode setting signal "a". The reset switching circuit 26 outputs a reset RS1 in the case of the operation mode setting signal "a" indicating the trimming mode, and outputs a reset RS2 in the case of the operation mode setting signal "a" indicating the product mode.

The setting circuit 28 performs trimming adjustment by use of the count value held by the memory circuit 24 or the trimming data stored in the storage unit 11, thereby setting the detection characteristics of the detection circuit 15. The setting circuit 28 may include a decode circuit 14 that outputs the result of decoding the count value held by the memory circuit 24 or the result of decoding the trimming data stored in the storage unit 11. The setting circuit 28 selects the divided resistance values of the detection resistors 16 in response to the output signal of the decode circuit 14, thereby performing trimming adjustment with respect to the division ratio of the power supply voltage VD between the power supply terminal VDD and the ground terminal VSS. This arrangement serves to set the detection characteristics of the detection circuit 15 for detecting the overcharge condition or the like.

The setting circuit 28 includes a data switching circuit 13 for switching over digital data for use in the trimming adjustment of the detection circuit 15 in response to the operation mode selected by the operation mode setting signal "a". The data switching circuit 13 selects the count value held by the memory circuit 24 for use in the trimming adjustment in the case of the operation mode setting signal "a" indicating the trimming mode. The data switching circuit 13 selects the trimming data stored in the storage unit 11 for use in the trimming adjustment in the case of the operation mode setting signal "a" indicating the product mode.

The setting circuit 28 includes a use switch circuit 19 that controls, in response to the operation mode selected by the operation mode setting signal "a", whether to use the count value held by the memory circuit 24 as a time length used by the control unit 18. The use switch circuit 19 applies the ground potential to the control unit 18 in the case of the operation mode setting signal "a" indicating the trimming mode so that the count value held by the memory circuit 24 is not utilized as a time length used in the control unit 18. The use switch circuit 19 applies the count value held by the memory circuit 24 to the control unit 18 in the case of the operation mode setting signal "a" indicating the product mode so that the count value is utilized as a time length used in the control unit 18.

Examples of the time length used in the control unit 18 include the overcharge detection delay time tVdet1, the over-discharge detection delay time tVdet2, the discharge over-current detection delay time tVdet3, and the charge over-current detection delay time tVdet4.

Figure 4:
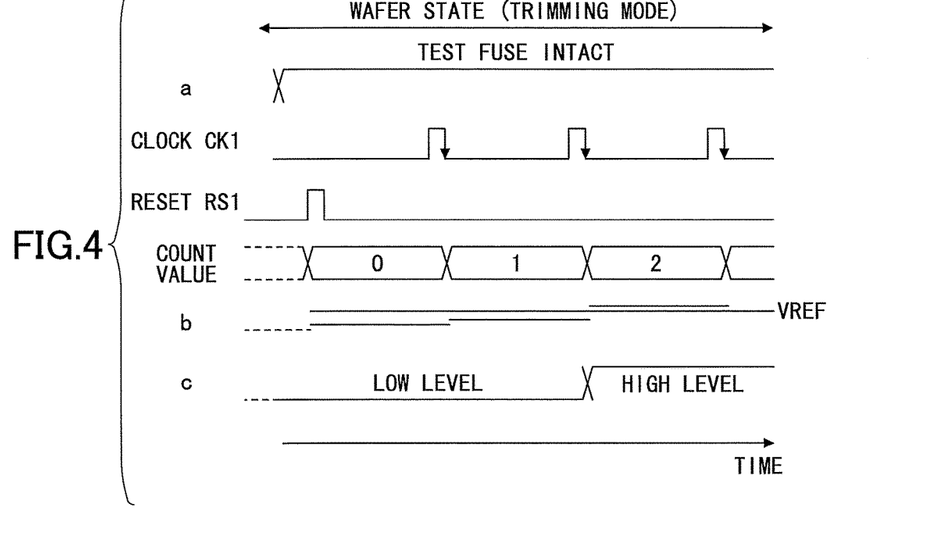
FIG. 4 is a timing chart illustrating an example of the operation of the semiconductor integrated circuit in a trimming mode.

FIG. 4 is a timing chart illustrating an example of the operation of the semiconductor integrated circuit in the trimming mode. FIG. 4 illustrates the operation of the semiconductor integrated circuit 5 performed during a test process prior to shipment. The operation illustrated in FIG. 4 will be described by referring to FIG. 3.

In the stage of the test process at which the semiconductor integrated circuit 5 in the wafer state is tested, the signal generating unit 9 produces the operation mode setting signal "a" indicating the trimming mode because the fuse 8 is intact. In this case, the clock switching circuit 25 selects the clock CK1 as an input clock signal for the memory circuit 24, and the reset switching circuit 26 selects the reset RS1 as an input reset signal for the memory circuit 24. In this case, further, the data switching circuit 13 selects the count value held by the memory circuit 24 for use in trimming adjustment, and the use switch circuit 19 applies the ground potential to the control unit 18.

In the case of the operation mode setting signal "a" indicating the trimming mode, the control circuit 27 causes the memory circuit 24 to operate such that the flip-flops 20 through 23 store a count value for setting the detection characteristics of the detection circuit 15 for detecting the overcharge condition or the like. The memory circuit resets the count value in response to the reset RS1 being input, followed by counting the number of incoming pulses of the clock CK1. The setting circuit 28 decodes the count value held by the memory circuit 24 to select the divided resistance values of the detection resistors 16 to provide a voltage division ratio corresponding to the decoded count value.

A test apparatus for testing the semiconductor integrated circuit 5 uses probes to monitor the counter value held by the memory circuit 24 and the comparison outcome signal "c" output from the comparator 17. In the example illustrated in FIG. 4, the comparison outcome signal "c" changes from the low level to the high level at the time the count value held by the memory circuit 24 changes to "2". The test apparatus stores in the storage unit trimming data corresponding to the count value "2" observed at the time of the change in the level of the comparison outcome signal "c". The storage unit 11 is a nonvolatile memory that is one-time programmable through blowing of fuses, for example. In such a case, the test apparatus blows some of the fuses of the storage unit 11 such that the storage unit 11 stores the trimming data corresponding to the count value "2" observed at the time of the change in the level of the comparison outcome signal "c".

Alternatively, the test apparatus may monitor the charge control terminal COUT or the discharge control terminal DOUT to detect a count value observed at the time of a change in the level of the control signal output from the charge control terminal COUT or the discharge control terminal DOUT.

The test apparatus blows the fuse 8 after storing in the storage unit 11 the trimming data determined from the count value. With this arrangement, the operation mode setting signal "a" output from the signal generating unit 9 changes from the high-level signal indicative of the trimming mode to the low-level signal indicative of the product mode.

Figure 5:
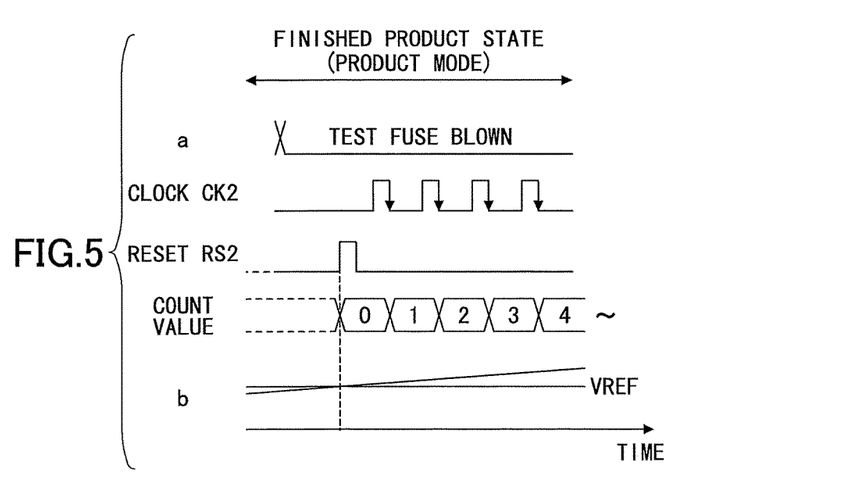
FIG. 5 is a timing chart illustrating an example of the operation of the semiconductor integrated circuit in a product mode.

FIG. 5 is a timing chart illustrating an example of the operation of the semiconductor integrated circuit in the product mode. FIG. 5 illustrates the operation of the semiconductor integrated circuit 5 in the finished product state that occurs after the test process. The operation illustrated in FIG. 5 will be described by referring to FIG. 3.

In the finished product state, the fuse 8 has already been blown as was described above. The signal generating unit 9 thus outputs the operation mode setting signal "a" indicative of the product mode. In this case, the clock switching circuit 25 selects the clock CK2 as an input clock signal for the memory circuit 24, and the reset switching circuit 26 selects the reset RS2 as an input reset signal for the memory circuit 24. In this case, further, the data switching circuit 13 selects the trimming data stored in the storage unit 11 for use in trimming adjustment, and the use switch circuit 19 supplies the count value held by the memory circuit 24 to the control unit 18.

The setting circuit 28 decodes the trimming data (i.e., the trimming data determined based on the count value during the test process) stored in the storage unit 11, followed by setting the divided resistance values of the detection resistors 16 such as to provide a voltage division ratio corresponding to the decoded trimming data. With this arrangement, the voltage division ratio as adjusted during the test process is reinstated in the product state. Namely, the setting circuit 28 serves to correct the product variation of detection characteristics of the detection circuit 15 in the product state.

The detection circuit 15, which compares the divided voltage "b" with the reference voltage VREF, inverts the level of the comparison outcome signal "c" upon detecting the divided voltage "b" crosses the reference voltage VREF. The reset RS2 is asserted in synchronization with the level inversion of the comparison outcome signal "c".

In the case of the operation mode setting signal "a" indicating the product mode, the control circuit 27 causes the memory circuit 24 to operate as a counter to measure a time length that is to be used in the control unit 18. The memory circuit 24 resets the count value in response to the reset RS2 being input, followed by counting the number of incoming pulses of the clock CK2. The count value held by the memory circuit 24 is used in the control unit 18 as a delay time relating to the protective operation of the battery 2.

In the case of the detection circuit 15 being an overcharge detection circuit, for example, the control unit 18 produces the charge control signal for turning off the switch unit 7 upon the memory circuit 24 counting a predetermined count value (i.e., the overcharge detection delay time tVdet1). In the case of the detection circuit 15 being an over-discharge detection circuit, for example, the control unit 18 produces the discharge control signal for turning off the switch unit 6 upon the memory circuit 24 counting a predetermined count value (i.e., the over-discharge detection delay time tVdet2).

According to the present embodiment described above, the shared use of the memory circuit 24 is achieved for both the purpose of temporarily holding trimming data in the trimming mode and the purpose of generating a time length used in the control unit 18 in the product mode. The utilization of chip area in the semiconductor integrated circuit 5 is thus improved. Further, there is no need to provide two separate circuits on the chip, one for temporarily holding trimming data in the trimming mode and the other for generating a time length used in the control unit 18 in the product state. This serves to reduce the chip size of the semiconductor integrated circuit 5.

Figure 6:
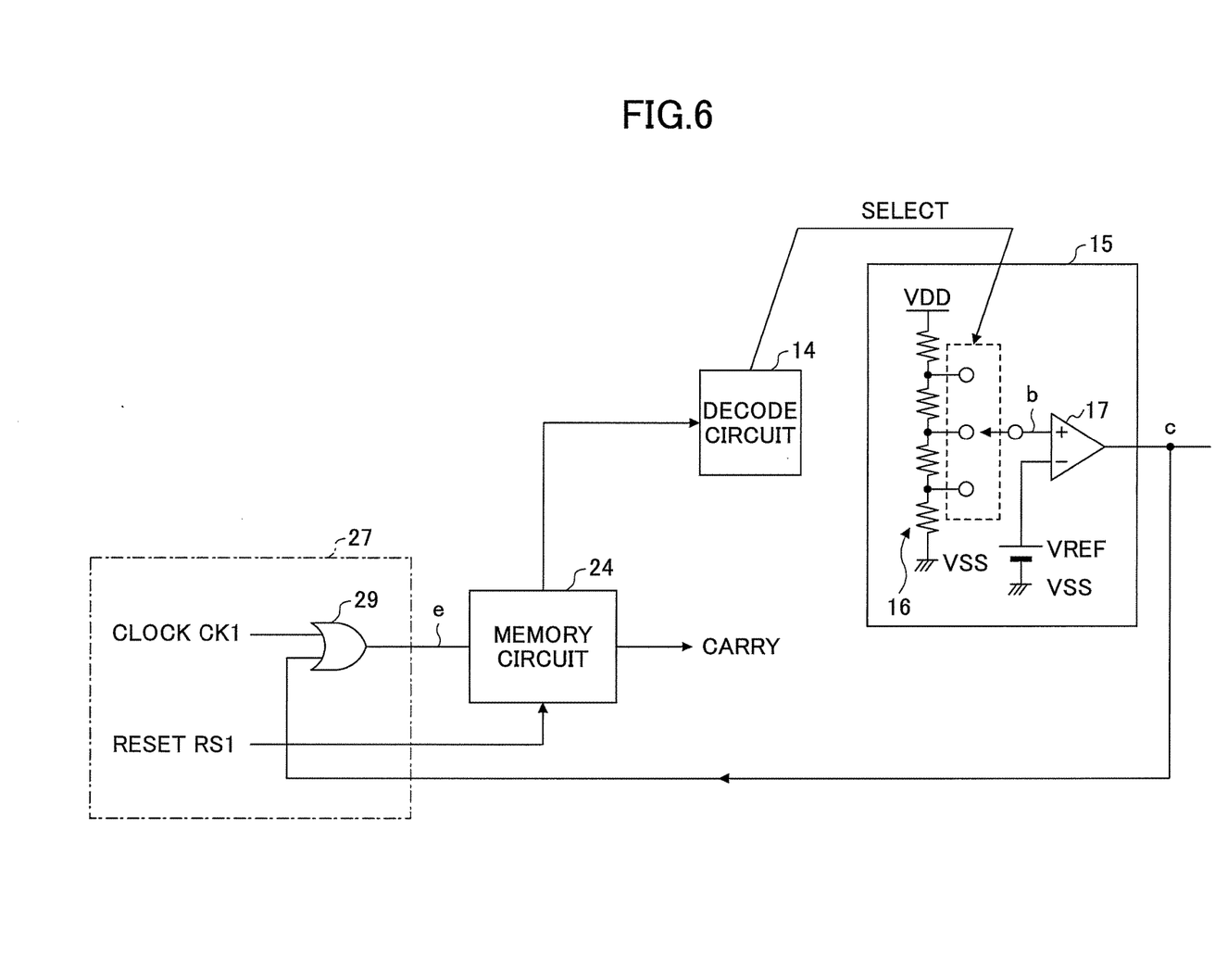
FIG. 6 is a drawing showing an example of an auto-calibration function of a control circuit.

FIG. 6 is a drawing showing an example of an auto-calibration function of the control circuit. The auto-calibration function is used in the trimming mode during the test process prior to the shipment of the semiconductor integrated circuit 5.

The control circuit 27 further includes a logical-OR gate 29 for producing the logical sum of the clock CK1 and the comparison outcome signal "c". This arrangement serves to automatically suspend the supply of the clock CK1 to the memory circuit 24 in response to the change to the high level of the comparison outcome signal "c".

Figure 7:
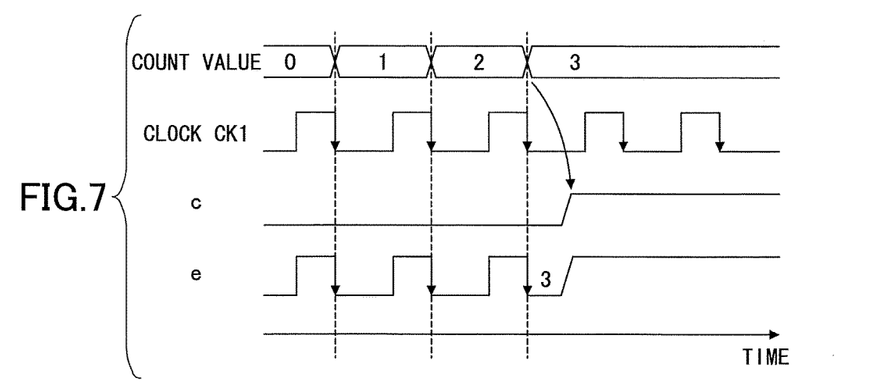
FIG. 7 is a timing chart illustrating an example of the counting of a clock by a memory circuit.

FIG. 7 is a timing chart illustrating an example of the counting of the clock CK1 by the memory circuit 24. In the example illustrated in FIG. 7, the memory circuit 24 continues to hold the count value "3" after the comparison outcome signal "c" changes to the high level.

The embodiment described above is directed to the configuration in which the test apparatus for testing the semiconductor integrated circuit 5 uses probes to monitor the counter value held by the memory circuit 24 and the comparison outcome signal "c" output from the comparator 17. Alternatively, the test apparatus may monitor the carry of the memory circuit 24 to acquire the count value held by the memory circuit 24 at the time of a change in the level of the comparison outcome signal "c", without placing probes in contact with the chip to monitor the count value and the comparison outcome signal "c".

The memory circuit 24 outputs the carry at the time the most significant bit becomes "1". The test apparatus resumes supplying a clock signal "e" to the memory circuit 24 after counting by the memory circuit 24 has automatically been stopped by the auto-calibration function. The test apparatus then continues to count the number of pulses of the clock signal "e" supplied to the memory circuit 24 until the carry of the memory circuit 24 is detected.

The number of pulses of the clock signal "e" supplied to the memory circuit 24 until the detection of the carry of the memory circuit 24 is denoted as X. The count value held by the memory circuit 24 at the time the counting by the memory circuit 24 is automatically stopped by the auto-calibration function is denoted as Y. Further, the number of series-connected flip-flops of the memory circuit 24 is denoted as n. In this case, the relationship $Y=2^{(n-1)}-X$ is satisfied. The test apparatus may calculate the count value held by the memory circuit 24 at the time of a change in the level of the comparison outcome signal "c" in accordance with the relationship $Y=2^{(n-1)}-X$, without placing probes in contact with the chip to monitor the count value and the comparison outcome signal "c".

Figure 8:
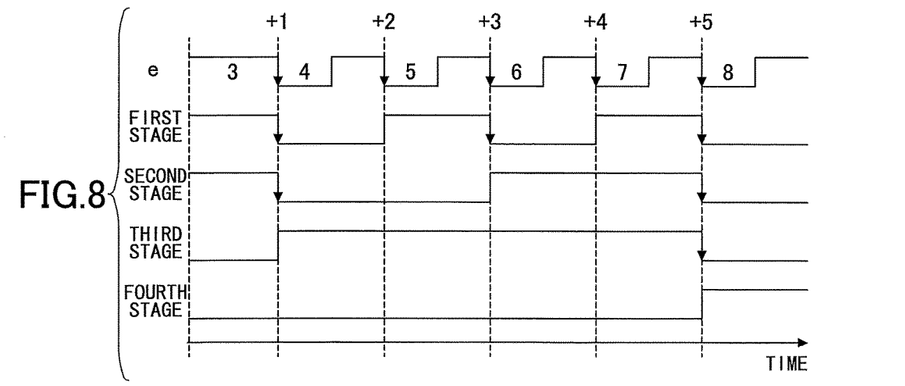
FIG. 8 is a timing chart illustrating an example of calculating a count value held by the memory circuit by use of the count of clock pulses.

FIG. 8 is a timing chart illustrating an example of calculating the count value held by the memory circuit 24 by use of the count of pulses of the clock signal "e". FIG. 8 illustrates the case in which n=4 and X=5. "FIRST STAGE" through "FOURTH STAGE" shown on the left-hand side of FIG. 8 indicate the outputs from the output terminals Q of the flip-flops 20 through 23, respectively. In the example illustrated in FIG. 8, Y is calculated as 3. The test apparatus stores trimming data corresponding to Y=3 in the storage unit 11.

Figure 9:
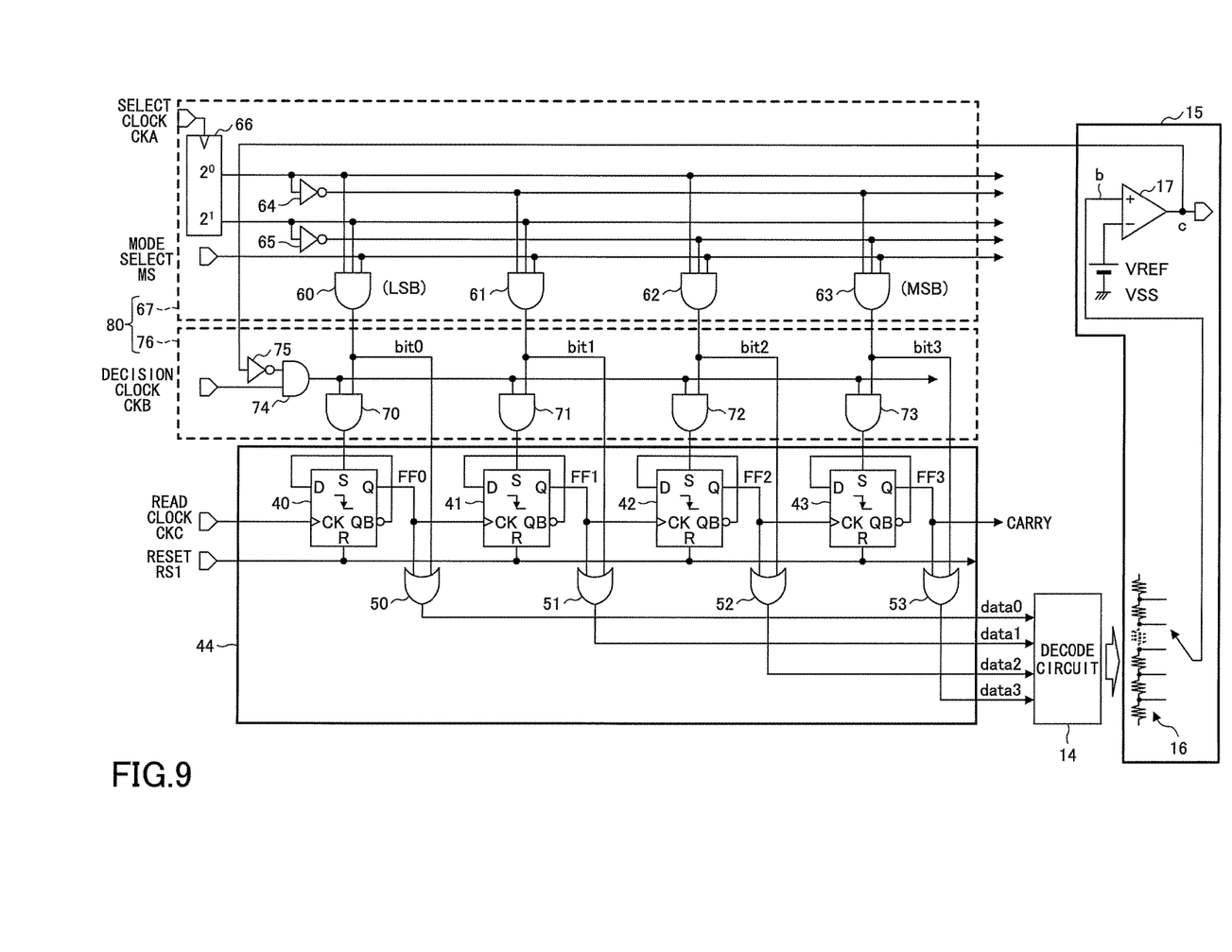
FIG. 9 is a drawing illustrating another example of the configuration of the memory circuit and the control circuit.

FIG. 9 is a drawing illustrating another example of the configuration of the memory circuit and the control circuit.

A memory circuit 44, which is an example of a volatile memory circuit having a plurality of flip-flops, includes four flip-flops 40 through 43 in this illustrated example. The memory circuit 44 temporarily stores a count value set by selectively applying a set signal to the set input S of the flip-flops 40 through 43. The memory circuit 44 counts up in synchronization with a read clock CKC. The four flip-flops 40 through 43 are series-connected. Each of the flip-flops 40 through 43 has a clock input CK, a data input D, an output Q, an inverted output QB, a reset input R, and a set input S.

The memory circuit 44 includes four logical-OR gates 50 through 53. The logical-OR gate 50 produces a logical sum data0 of an output FF0 of the flip-flop 40 at the LSB (i.e., least significant bit) and a select bit bit0 that is the output of a logical-AND gate 60. The logical-OR gate 51 produces a logical sum data1 of an output FF1 of the flip-flop 41 and a select bit bit1 that is the output of a logical-AND gate 61. The logical-OR gate 52 produces a logical sum data2 of an output FF2 of the flip-flop 42 and a select bit bit2 that is the output of a logical-AND gate 62. The logical-OR gate 53 produces a logical sum data3 of an output FF3 of the flip-flop 43 at the MSB (i.e., most significant bit) and a select bit bit3 that is the output of a logical-AND gate 63.

A control circuit 80 outputs a clock signal and a reset signal for controlling the memory circuit 44. The control circuit 80 performs consecutive comparisons to cause the flip-flops 40 through 43 to store a count value for setting the detection characteristics of the detection circuit 15. The control circuit 80 performs consecutive comparisons successively from the MSB such that the reference voltage VREF coincides with the divided voltage "b" that is adjusted by the decode circuit 14 based on the count value (data0 through data3) of the memory circuit 44. The control circuit 80 includes a select circuit 67 and a detection circuit 76.

The select circuit 67 selects one of the flip-flops 40 through 43 successively from the MSB for storing a corresponding bit of the count value. The select circuit 67 includes a binary counter 66, inverters 64 and 65, and logical-AND gates 60 through 63.

The detection circuit 76 finalizes the bit value of the flip-flop selected by the select circuit 67 in synchronization with a detection clock CKB while a tentative count value (data0 through data3) is present in the flip-flops 40 through 43. The detection circuit 76 includes an inverter 75 and logical-AND gates 70 through 73.

Figure 10:
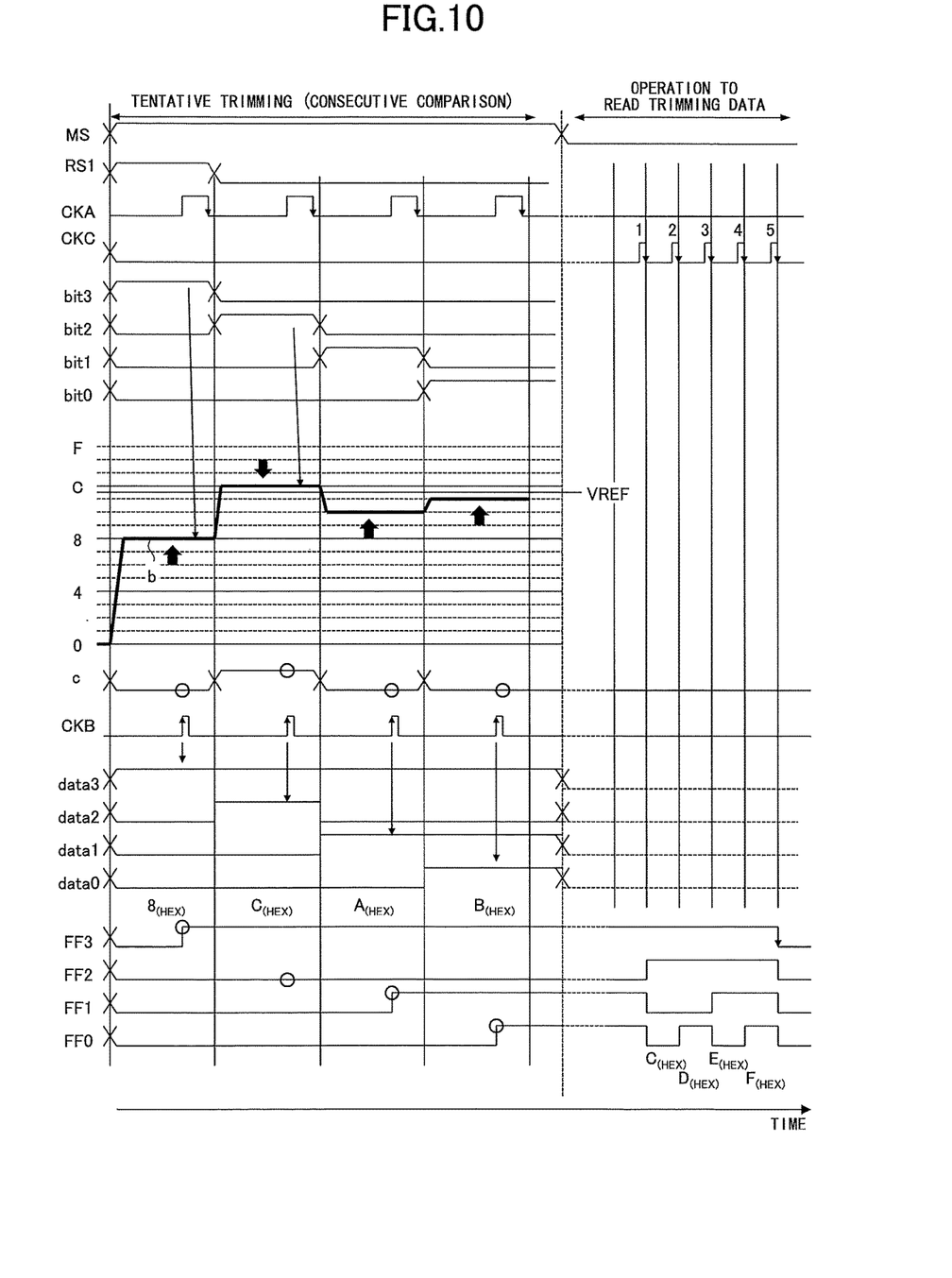
FIG. 10 is a timing chart illustrating an example of the operation of the circuit illustrated in FIG. 9.

FIG. 10 is a timing chart illustrating an example of the operation of the circuit illustrated in FIG. 9. A description of FIG. 10 will be given by referring to FIG. 9.

The select circuit 67 of the control circuit 80 produces the signals bit3 through bit0 for causing one of the flip-flops 40 through 43 to store a corresponding bit of the count value for setting the characteristic of the detection circuit 15 when a mode select signal MS is high. Each time the pulse of a select clock CKA is received, the binary counter 66 changes the signals bit3 through bit0 in the following sequence: "1000", "0100", "0010", and "0001".

The detection circuit 76 finalizes (i.e., sets "1" to or leaves "0" unchanged as) the data of the flip-flop 43 (i.e., the output FF3) among the flip-flops 40 through 43 in response to the first pulse of the detection clock CKB. The detection circuit 76 finalizes (i.e., sets "1" to or leaves "0" unchanged as) the data of the flip-flop 42 (i.e., the output FF2) among the flip-flops 40 through 43 in response to the second pulse of the detection clock CKB while the output FF3 remains in the finalized state. The detection circuit 76 finalizes (i.e., sets "1" to or leaves "0" unchanged as) the data of the flip-flop 41 (i.e., the output FF1) among the flip-flops 40 through 43 in response to the third pulse of the detection clock CKB while the outputs FF3 and FF2 remain in the finalized state. The detection circuit 76 finalizes (i.e., sets "1" to or leaves "0" unchanged as) the data of the flip-flop 40 (i.e., the output FF0) among the flip-flops 40 through 43 in response to the fourth pulse of the detection clock CKB while the outputs FF3, FF2, and FF1 remain in the finalized state.

In the illustrated example, $B_{(HEX)}$ (which is equal to $11_{(DEC)}$) is obtained as the count value (FF0 through FF3) that provides the divided voltage "b" coinciding with the reference voltage VREF. Here, HEX indicates a hexadecimal number, and DEC indicates a decimal number.

In order to read the trimming data from the memory circuit 44, the test apparatus applies the read clock CKC, and sets the mode select signal MS to the low level. The test apparatus counts the number of clock pulses until the carry indicative of the most-significant-bit output FF3 changes to the low level, thereby obtaining the count value (which is equal to $B_{(HEX)}=11_{(DEC)}$) stored in the memory circuit 44.

Figure 11:
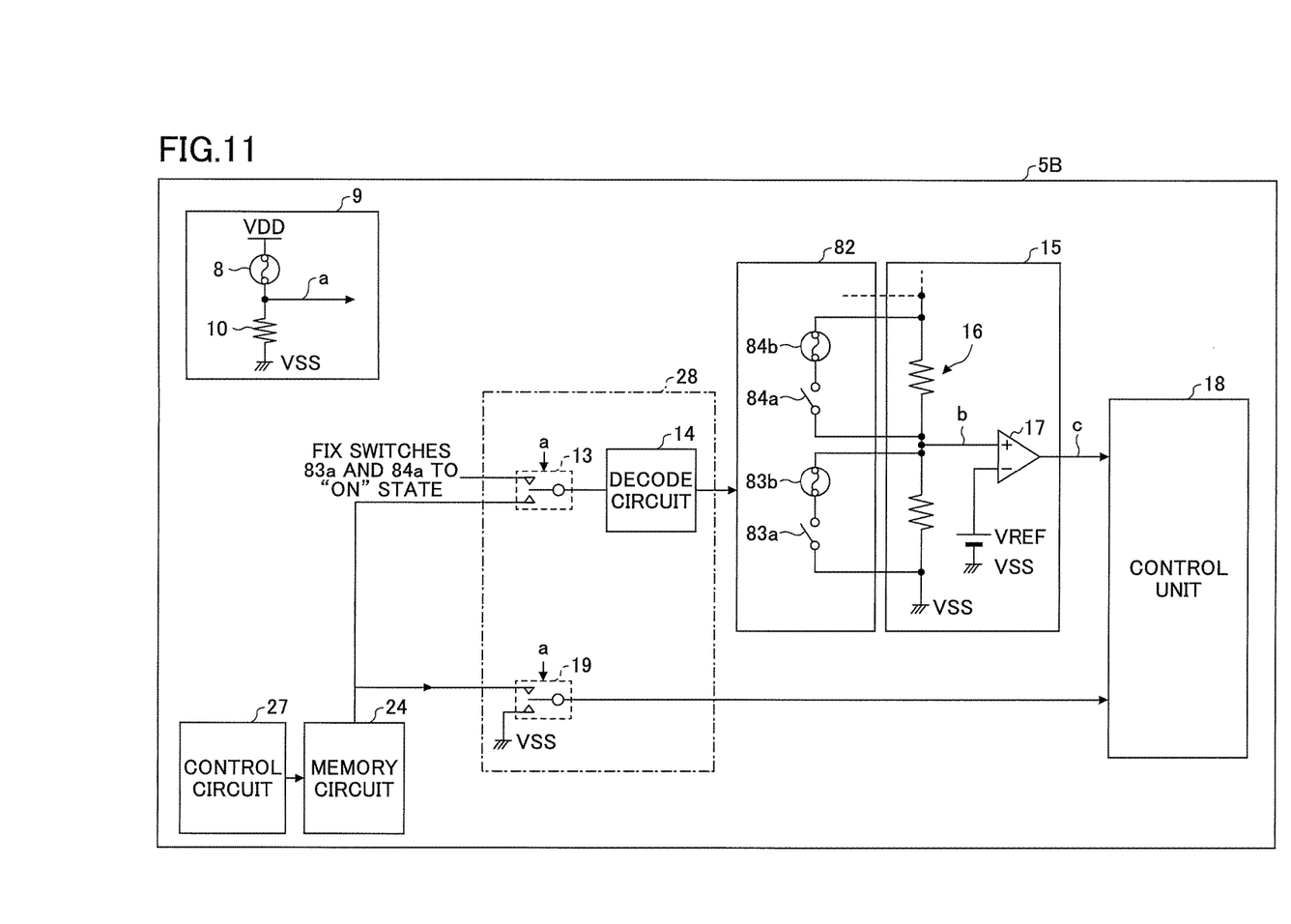
FIG. 11 is a drawing illustrating another example of the configuration of the semiconductor integrated circuit.

FIG. 11 is a drawing illustrating another example of the configuration of the semiconductor integrated circuit. A semiconductor integrated circuit 5B illustrated in FIG. 11 is an example of the semiconductor integrated circuit 5 previously described. A duplicate description will not be provided with respect to the same or similar configurations as those of the semiconductor integrated circuit 5A.

A storage unit 82 stores trimming data. The trimming data is stored in the storage unit 82 during the test process of the semiconductor integrated circuit 5A. The storage unit 82 is a nonvolatile memory that is one-time programmable through blowing of fuses. The storage unit 82 includes a plurality of cut circuits, each of which is connected in parallel with a corresponding one of the detection resistors 16. The number of the circuits is determined based on the data size of stored trimming data.

In the storage unit 82, one cut circuit has a switch 83a and a fuse 83b connected in series, and another cut circuit has a switch 84a and a fuse 84b connected in series. Each of the remaining resistor elements is connected in parallel with a corresponding cut circuit having the same configuration as those illustrated in FIG. 11.

The setting circuit 28 performs trimming adjustment by use of the count value held by the memory circuit 24 or the trimming data stored in the storage unit 82, thereby setting the detection characteristics of the detection circuit 15. The setting circuit 28 has the decode circuit 14 that decodes the count value held by the memory circuit 24, or decodes data for placing all the switches of the cut circuits of the storage unit 82 in the "on" state, followed by outputting the decoded data. The setting circuit 28 selects the divided resistance values of the detection resistors 16 in response to the output signal of the decode circuit 14, thereby performing trimming adjustment with respect to the division ratio of the power supply voltage VD between the power supply terminal VDD and the ground terminal VSS. This arrangement serves to set the detection characteristics of the detection circuit 15 for detecting the overcharge condition or the like.

The data switching circuit 13 selects the count value held by the memory circuit 24 for use in the trimming adjustment in the case of the operation mode setting signal "a" indicating the trimming mode. The data switching circuit 13 selects the data for placing all the switches of the cut circuits of the storage unit 82 in the "on" state for use in the trimming adjustment in the case of the operation mode setting signal "a" indicating the product mode.

In the trimming mode performed in the wafer state, the test apparatus stores in the storage unit 82 trimming data corresponding to the count value observed at the time of a change in the level of the comparison outcome signal "c". The test apparatus blows one or more fuses among the fuses (e.g., 83b, 84b) of the storage unit 82 such that the storage unit 82 stores the trimming data corresponding to the count value as observed at the time of a change in the level of the comparison outcome signal "c".

In the product mode performed in the finished product state, the setting circuit 28 decodes the data for placing all the switches of the cut circuits of the storage unit 82 in the "on" state, thereby causing the voltage division ratio of the detection resistors 16 to correspond to the above-noted count value. With this arrangement, the voltage division ratio as adjusted during the test process is reinstated in the product state. Namely, the setting circuit 28 serves to correct the product variation of detection characteristics of the detection circuit 15 in the product state.

The two opposite ends of a resistor parallel-connected with a cut circuit in which the switch is in the "on" state and the fuse is intact are short-circuited through this cut circuit, so that the resistance value between these two ends is effectively zero. The two opposite ends of a resistor parallel-connected with a cut circuit in which the switch is in the "on" state and the fuse is blown are not short-circuited through this cut circuit, so that the resistance value of the resistor appears between these two ends. In this manner, trimming adjustment is performed with respect to the divided resistance values of the detection resistors 16.

Although the semiconductor integrated circuit has been described by referring to the embodiments, the present invention is not limited to these embodiments. Various modifications and improvements such as combining or replacing an embodiment partially or entirely with one or more other embodiments may be made without departing from the scope of the present invention.

For example, the positions of the switch units 6 and 7 may be swapped with each other in FIG. 2. Although the switch units 6 and 7 are placed in series in the power supply line connected to the negative pole 2b, these units may be placed in series in the power supply line connected to the positive pole 2a. Alternatively, the switch units 6 and 7 may be embedded in the semiconductor integrated circuit 5.

Further, the memory circuit having a plurality of flip-flops is not limited to a counter circuit, and may alternatively be a register.

The present application is based on and claims the benefit of priority of Japanese priority application No. 2016-190349 filed on Sep. 28, 2016, with the Japanese Patent Office, the entire contents of which are hereby incorporated by reference.

What is claimed is:

1. A semiconductor integrated circuit, comprising:
a first circuit;
a second circuit;
a memory circuit having a plurality of flip-flops;
a storage unit implemented as nonvolatile memory elements;
a signal generating unit implemented as one or more nonvolatile memory elements to produce an operation mode setting signal for selecting one of a plurality of operation modes;
a control circuit configured to cause the memory circuit to operate such that the plurality of flip-flops holds a value for setting characteristics of the first circuit when the signal generating circuit produces the operation mode setting signal indicative of a first operation mode, and configured to cause the memory circuit to operate as a counter to measure a time length used in the second circuit when the signal generating circuit produces the operation mode setting signal indicative of a second operation mode; and a setting circuit configured to cause trimming data stored in the storage unit to set the characteristic of the first circuit to correct product variation therein when the signal generating circuit produces the operation mode setting signal indicative of the second operation mode, the trimming data corresponding to the value held by the memory circuit, wherein the control circuit includes a clock switching circuit configured to supply a first clock as clock inputs into the plurality of flip-flops in response to the operation mode setting signal indicating the first operation mode, and to supply a second clock as the clock inputs into the plurality of flip-flops in response to the operation mode setting signal indicating the second operation mode.

2. The semiconductor integrated circuit as claimed in claim 1, wherein the time length used in the second circuit relates to a delay time of a protective operation for a secondary battery.

3. The semiconductor integrated circuit as claimed in claim 1, wherein the storage unit is a memory that is one-time programmable through blowing of fuses.

4. The semiconductor integrated circuit as claimed in claim 1, wherein the control circuit is configured to cause the value held by the memory circuit to be set to the plurality of flip-flops one bit at a time through consecutive comparisons.

* * * * *